United States Patent [19]

dos Santos Pereiro Ribeiro

[11] Patent Number: 4,826,584

[45] Date of Patent: May 2, 1989

[54] MAGNETRON SPUTTERING CATHODE

[76] Inventor: Carlos A. dos Santos Pereiro Ribeiro, Von Stauffenbergstrasse 12, 7470 Albstadt 15, Fed. Rep. of Germany

[21] Appl. No.: 38,973

[22] Filed: Apr. 16, 1987

[30] Foreign Application Priority Data

Apr. 17, 1986 [DE] Fed. Rep. of Germany ....... 3613018

[51] Int. Cl.⁴ .............................................. C23C 14/00
[52] U.S. Cl. .................................................... 204/298
[58] Field of Search ................ 204/298, 192.1, 192.12, 204/298 PM, 298 CS

[56] References Cited

U.S. PATENT DOCUMENTS

| 4,374,722 | 2/1983 | Zega | 204/192.12 |
| 4,430,190 | 2/1984 | Eilers et al. | 204/192.12 |
| 4,437,966 | 3/1984 | Hope et al. | 204/298 |
| 4,461,688 | 7/1984 | Morrison | 204/298 |
| 4,485,000 | 11/1984 | Kawaguchi et al. | 204/298 |
| 4,498,969 | 2/1985 | Ramachandrian | 204/298 |
| 4,500,409 | 2/1985 | Boys et al. | 204/298 |
| 4,569,745 | 2/1986 | Nagashima | 204/298 |
| 4,600,489 | 7/1986 | Lefkow | 204/192.12 |
| 4,631,106 | 12/1986 | Nakazato et al. | 204/298 |

FOREIGN PATENT DOCUMENTS

| 2735525 | 2/1979 | Fed. Rep. of Germany. |
| 3519907 | 1/1986 | Fed. Rep. of Germany. |
| 2573441 | 5/1986 | France | 204/298 |
| 0086272 | 5/1985 | Japan | 204/298 |

Primary Examiner—John F. Niebling
Assistant Examiner—Steven P. Marquis
Attorney, Agent, or Firm—Nies, Webner, Kurz & Bergert

[57] ABSTRACT

A magnetron sputtering cathode with a target plate of the material to be sputtered connected to a support body of non-magnetic material, having a chamber disposed between the support body and the target plate, with a coolant flowing through said chamber, said chamber being formed by a recess in said support body, with said recess being tightly covered by said target plate; and having a permanent magnet system disposed beneath the target plate, wherein the target plate (10) abuts the front side of a plate-shaped support body (13) and the likewise plate-shaped permanent magnet system (12) abuts the back side thereof, and the permanent magnet system (12) has a plurality of continuous, meshing magnetic pole tongues (17, 19) of opposing polarity and arranged in spaced relationship to each other, with said tongues being coupled together via a magnet bridge (20) and producing a magnetic field of meandering shape extending substantially solidly over the entire surface of the target plate.

6 Claims, 1 Drawing Sheet

MAGNETRON SPUTTERING CATHODE

BACKGROUND OF THE INVENTION

This invention refers to a magnetron sputtering cathode of the type which has a target plate of the material to be sputtered connected to a support body of non-magnetic material, a chamber disposed between the support body and the target plate, coolant flowing through the chamber, and the chamber formed by a recess in the support body, the recess being tightly covered by the target plate, and a permanent magnet system disposed beneath the target plate.

Such a magnetron sputtering cathode is a component of an apparatus for coating substrates, with the coating material in each case, here the target material, being precipitated from the gas phase onto the substrate to be coated. The target material is converted to the gas phase by sputtering. In this sputtering process, material is knocked from the target by ion bombardment of the target. The ions required for the sputtering process are generally produced by collisions of gas atoms and electrons in a glow discharge and are accelerated into the target forming the cathode with the aid of an electric field. The substrates, arranged at suitable locations, catch the atoms knocked out of the target material and in this way are coated with the target material.

In a magnetron sputtering cathode such as that mentioned above, a magnetic field is used to encompass the glow discharge plasma and thereby to lengthen the path of the electrons, so that the collision rate of gas atoms and electrons is increased. By this means a sputtering yield higher than in apparatus working without magnetic restriction occurs. Furthermore, the sputtering process can be carried out with a substantially lower gas pressure.

The magnet system of known magnetron sputtering cathodes is generally designed with a circular or annular discharge area formed on the target plate. A considerable disadvantage of these known cathodes is that the cathode width is limited by the realizable width of the target erosion zone. By target erosion zone the discharge area on the target surface is meant, i.e. the area in which the target material is effectively sputtered off. The width of this target erosion zone depends primarily on the spacing of the magnetic poles, but also on the distance between the magnet system and the target surface. These distances can not be altered arbitrarily, as the erosion profile becomes less favorable with increasing distance between the magnetic poles, due to the lessening strength of the magnetic field. This limited cathode width makes the even coating of a larger workpiece or a plurality of workpieces considerably more difficult. The arrangement of several of the known magnetron sputtering cathodes adjacently does improve the coating conditions; however, each cathode needs its own power supply, whereby this solution becomes extremely costly. A further disadvantage of the known magnetron sputtering cathode is that due to the circular or annular form of the target erosion zone, only a small portion of the entire target plate can be exploited for the sputtering.

Also, the necessary and efficient cooling of the target plate and of the magnet system presents a further problem with these known cathodes. For example, in the cathode described above, a direct cooling of the back side of the target plate is provided; however, cooling takes place only in the direct area of the annular erosion zone by means of a turbulently flowing coolant. In order to achieve adequate movement of the coolant and to prevent the coolant from coming to a standstill in remote corners, a correspondingly high coolant pressure must be selected. This results in a relatively large difference between the pressure in the cooling chamber and the pressure in the vacuum chamber surrounding it, so that target distortion or ruptures in the target material can not be ruled out. To avoid this, the known magnetron sputtering cathode can only be operated with relatively low cathode output.

SUMMARY OF THE INVENTION

In view of this prior art, the object of the present invention is to create a magnetron sputtering cathode of the type in question, by means of which substantially greater cathode output with improved yield of the target material can be realized.

This task is solved by application of the features given in the characterizing part of claim 1.

The core of the invention consists in determining a discharge area on the target surface such that the central line of this area forms a meandering, closed loop. By means of the meandering or snake-like course of the erosion zone, virtually any size of target surface can be achieved. Furthermore, the magnetic poles can be moved so close together that the target erosion occurs very evenly and considerably more broadly than in the known circular or annular target erosion zones of known cathodes.

But the meandering design of the magnet system also leads to an increase in the exploitability of the target and in the coating rate, since virtually the entire target surface becomes the erosion zone.

In addition, by means of the cooling system designed in accordance with the invention, with use of the features of claims 4 and 5 practically the entire surface of the target plate is evenly cooled, so that cathode output in excess of 30 W/cm$^2$ instead of the previously reachable 10 to a maximum of 15 W/cm$^2$ can be realized. By the conducting of the coolant in the cooling chamber as suggested according to the invention, a substantially laminar fluid flow across the entire area of the chamber can be achieved, and therefore no "dead" zones with virtually stagnant fluid can be formed. The laminar coolant flow allows the use of a positve pressure of less than 0.5 bar for the coolant, thus ruling out target distortions or ruptures in the target material.

The selected layer thickness of the fluid flowing through the cooling chamber can be relatively small, advantageously approximately 2 to 4 mm in thickness, which in turn is advantageous insofar as the plate-shaped magnet system comes to lie very close to the target plate. Due to the plate-like shape of the magnet system, it can abut the cooling chamber floor with its entire surface, whereby it is likewise adequately cooled by the fluid flowing through the chamber.

From the above it becomes clear that the magnetron sputtering cathode according to the invention can be operated with substantially higher output than one of conventional design, so that on the basis of the substantially higher coating rate, a plurality of workpieces or a larger workpiece than would be possible according to the prior art can be coated at once with only one single cathode embodied according to the invention.

It is of advantage to provide a leak detecting means in the border sealing area of the target plate and the plate-shaped support body, that is in the sealing area of cooling chamber/vacuum, which detecting means, in the simplest case, consists of a single bore through the support body, which bore opens between an outer sealing ring and an inner sealing ring in parallel, spaced relationship thereto, in the border area of the cooling system, with said bore being connected to a vacuum pump.

According to a further advantageous embodiment of the invention, the target plate is clamped together with the support body by means of clamps provided as screw clamps. Clamping means of this type allow a suitable contact pressure of the target plate on the support body to be set. As it is possible to arrange the tightening screws of the clamping means on the back side of the target plate and thus turned away from the surface to the sputtered, they are not coated with target material, which is favorable for the stabilization of the plasma.

Particularly with large-surfaced target plates it is advantageous to provide tightening screws or the like outside of the actual discharge area, but in the area of the target center, to thereby prevent an arching of the target plate.

An efficient cooling system is important for a magnetron sputtering cathode working properly and free of disturbances. However, conventional cooling systems can not be used, due to the substantially greater power of the cathode. Therefore, in further development of the subject matter of the invention a cooling system is to be used in which the coolant flows in substantially laminar fashion through the large-surfaced cooling chamber over the entire cross section from one end to the other as evenly as possible.

Additional features and advantageous embodiments of the magnetron sputtering cathode according to the invention can be seen in the subclaims and the following description of a particularly preferred embodiment as shown in FIGS. 1 to 6 of the drawings.

DETAILED DESCRIPTION OF THE DRAWINGS

Figure 1:
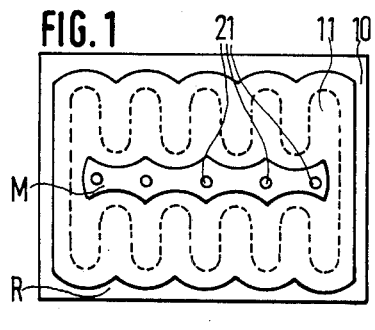
FIG. 1 shows a schematic plan view of the meandering erosion zone of the sputtering cathode embodied according to the invention.
Figure 2:
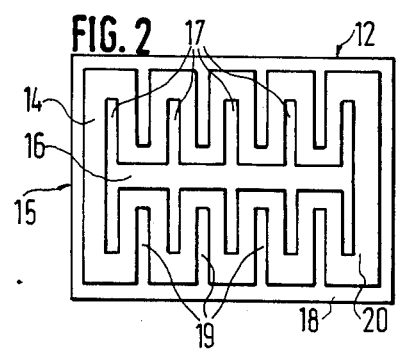
FIG. 2 shows a plan view of a plate-shaped permanent magnet system for producing the meandering erosion zone according to FIG. 1.
Figure 3:
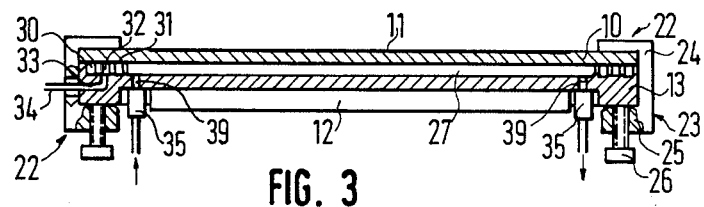
FIG. 3 shows a cross section through the magnetron sputtering cathode according to the invention.

As seen in FIGS. 1 to 3, the magnetron sputtering cathode according to the invention consists of the target plate 10, from the erosion zone 11 of which the material is sputtered, the magnet system 12 (FIGS. 2 and 3) and the plate-shaped support body 13 disposed therebetween.

As FIG. 2 shows, the magnet system 12 comprises an inner magnetic pole, the magnetic south pole 14, and an outer magnetic pole, the magnetic north pole 15. The inner south pole 14 consists of a central bar 16 disposed along the central line, with the equally spaced apart tongues 17 extending outwardly at right angles to said central bar. The outer magnetic north pole 15 consists of a rectangular frame 18, with the tongues 19 extending inwardly from the two long frame sides and at right angles thereto, said tongues being arranged to lie between two tongues 17 each of the south pole 14.

As a result of this arrangement or design of the two magnetic poles 14 and 15, a meandering course of the magnetic field formed between the magnetic poles and practically covering the surface is achieved. The two magnetic poles 14 and 15 are substantially of equal thickness, in the range of several millimeters to approximately 2 cm. Furthermore, the two poles are coupled together via a plate-shaped magnet bridge 20.

Figure 6:
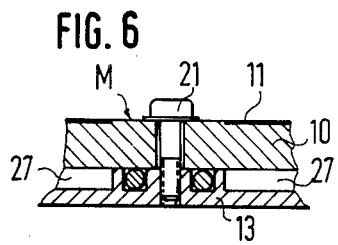
FIG. 6 shows a section through the target plate and the support body in their central areas.

The erosion zone 11, which covers by far the largest part of the target plate 10, is designed to correspond with the meandering shape of the magnetic field (FIG. 1). Not covered by the magnetic field is merely a narrow, outlying marginal area R and a central area M lying along the central line, which is not influenced in the sputtering process, so that the tightening screws 21 for the liquid-tight screw connection of the target plate 10 to the underlying support body 13 can be disposed there, as shown in FIG. 6.

The target plate 10 and the plate-shaped support body 13 are interconnected along the outer long edges by means of a clamping device 22 consisting of screw clamps 23. Each screw clamp 23 consists of a profile bar 24, with several tightening screws 26 disposed in its lower arm 25 opposite the target plate 10, to clamp the two plates together with the necessary tension. On the front side of the support body 13 there is a rectangular recess forming the cooling chamber 27, the entire surface of said recess being covered by the target plate 10. A coolant flows through the hollow space of the cooling chamber 27 and cools the target plate 10 on the one hand and the magnet system plate 12 connected at the back side of the support body 13 on the other.

Figure 4:
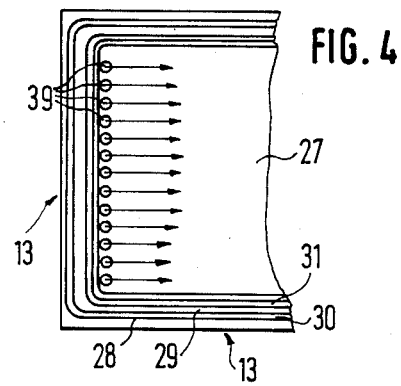
FIG. 4 shows a plan view of the support body of the magnetron sputtering cathode according to FIG. 3.

As shown in FIGS. 3 and 4, for sealing purposes two grooves 28 and 29 are located in the marginal area of the support body 13 parallel to the edge. The two sealing rings 30 and 31 are laid into these grooves and guarantee a tight closure of the cooling chamber 27 from the outside with the target plate 10 securely clamped. Furthermore, a leak detector means is provided, which consists of a groove 32 arranged between the sealing rings 30 and 31, a connecting passage 33 opening into said groove, a connecting conduit 34, a pressure guaging device and a vacuum pump.

The supply and removal of the coolant flowing through the cooling chamber 27 occurs by means of the connecting elements 35 connected to the support body 13 on its back side, on opposite sides from each other and to the side of the magnet system plate 12.

Figure 5:
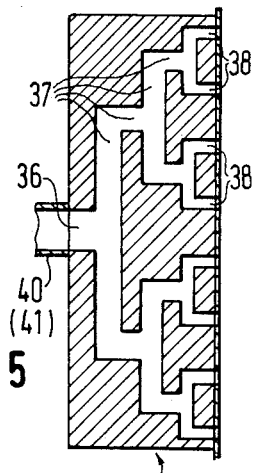
FIG. 5 shows a section through a connecting element for the supply and removal of the coolant to and from the coolant chamber.

As FIG. 5 shows, a large number of branching passages 37 starting from the entry or outlet passage 36 is disposed in the connecting elements 35, with the final branches 38 thereof ending at the openings 39 in the support body 13 opening into the cooling chamber 27. The connecting elements 35 are connected to the supply or outlet conduits 40 and 41, with the coolant being supplied or removed through them. By means of the symmetrical branching of the passages 37 and the large number of entry or outlet orifices 39 arranged in a row, the even, substantially laminar flow of the coolant through the cooling chamber 27 is achieved. To achieve favorable flowing conditions the inner height of the cooling chamber 27 should amount to between 1 and 10 mm, but preferably 2 to 4 mm.

What is claimed is:

1. A magnetron sputtering cathode with a target plate of the material to be sputtered connected to a plate-shaped rectangular support body of non-magnetic material, having a flat but essentially plate shaped chamber disposed between said support body and said target plate, means enabling a coolant flowing through said chamber, said chamber being formed by a recess in and within the peripheral edges of said support body, with said recess being essentially as large in area as but tightly covered by said target plate; and a permanent magnet system disposed beneath the target plate, said target plate (10) disposed to abut the front side of said plate-shaped support body (13) and the permanent magnet system (12) having a similar plate-shape which abuts the back side of said support body and said permanent magnet system (12) has a plurality of continuous, meshing magnetic pole tongues (17, 19) of opposing polarity arranged in spaced relationship to eachother, said meshing pole tongues being provided by an inner magnetic bar pole (14) extending bar-like and disposed relative to the central line of said target plate with pole tongues (17) of a first polarity, equally spaced apart and projecting essentially laterally outwardly therefrom, and by an outer rectangular frame-shaped magnetic pole (15), with a plurality of spaced-apart pole tongues (19) of a second polarity opposite that of said first polarity projecting inwardly from the opposite long sides thereof toward the said inner magnetic bar pole (14) and with the pole tongues (19) having said second polarity each disposed in a space between two adjacent spaced apart, outwardly projecting, pole tongues (17) of said first polarity; with said tongues of opposed polarity being coupled together via a magnet bridge (20) and producing a magnetic field of meandering shape extending substantially solidly over the entire surface of said target plate to constitute a target erosion zone with a single, substantially continuous surface, excepting for a narrow middle zone; said means enabling a coolant to flow through said chamber (27) comprising connecting elements (35) attached to the rectangular, plate-shaped support body (13) at two opposite ends, each of said connecting elements communicating via a plurality of orifices (39) through said support body with the chamber (27) and including a means (36) to enable fluid communication with a coolant conduit (41, 41), one of said connecting elements providing coolant entry flow to and laterally across one end of said chamber and another of said connecting elements providing coolant removal flow from and laterally across the other end of said chamber; and each of said connecting elements (35) comprise a system (37) of branched passages, starting from the means (36) which enables fluid communication with a coolant conduit, with the end branches (38) thereof opening into said plurality of orifices (39) spaced apart at regular intervals in the end of said support body (13).

2. A magnetron sputtering cathode according to claim 1, characterized by a leak detecting device disposed in the marginal sealing area of target plate (10) and support body (13).

3. A magnetron sputtering cathode according to claim 2, characterized in that the leak detector device consists of a groove (32) between two sealing rings (30, 31) disposed in parallel relationship to each other along the edge of the support body (13), a passage (33) opening into said groove (32) and connected to a vacuum conduit 34), and a pressure guage.

4. A magnetron sputtering cathode according to claim 1, characterized in that the target plate (10) is connected with the plate-shaped support body (13) in the marginal sealing area by means of a clamping device (22) consisting of screw clamps (23).

5. A magnetron sputtering cathode according to claim 4, characterized in that the target plate (10) is additionally connected to the plate-shaped support body (13) in the central area M by means of several tightening screws (21) screwed in through bores in the target plate (10) and on into tapholes in the support body (13), with said screws being located above the magnetic pole bar (16) lying along the central line.

6. A magnetron sputtering cathode according to claim 1, characterized in that the inner height of the cooling chamber (27) is between 1 and 10 mm, preferably approximately between 2 and 4 mm.

* * * * *